(12) United States Patent
    Takemoto

(10) Patent No.: US 11,127,709 B2
(45) Date of Patent:    Sep. 21, 2021

(54) CAPILLARY TRANSPORT DEVICE, CAPILLARY MOUNTING DEVICE, CAPILLARY REPLACEMENT DEVICE, CAPILLARY TRANSPORT METHOD, CAPILLARY MOUNTING METHOD, AND CAPILLARY REPLACEMENT METHOD

(71) Applicant: KAIJO CORPORATION, Tokyo (JP)

(72) Inventor: Go Takemoto, Tokyo (JP)

(73) Assignee: KAIJO CORPORATION, Tokyo (JP)

(*) Notice: Subject to any disclaimer, the term of this patent is extended or adjusted under 35 U.S.C. 154(b) by 84 days.

(21) Appl. No.: 16/693,966

(22) Filed: Nov. 25, 2019

(65) Prior Publication Data

US 2020/0091107 A1    Mar. 19, 2020

Related U.S. Application Data

(62) Division of application No. 15/566,021, filed as application No. PCT/JP2016/079730 on Oct. 6, 2016, now Pat. No. 10,529,684.

(30) Foreign Application Priority Data

Dec. 17, 2015 (JP) .............................. JP2015-246301

(51) Int. Cl.
    *B23K 20/00* (2006.01)
    *H01L 23/00* (2006.01)

(52) U.S. Cl.
    CPC ............ *H01L 24/78* (2013.01); *B23K 20/005* (2013.01); *H01L 2224/1134* (2013.01); *H01L 2224/45124* (2013.01); *H01L 2224/45144* (2013.01); *H01L 2224/45147* (2013.01); *H01L 2224/78* (2013.01); *H01L 2224/78301* (2013.01);
    (Continued)

(58) Field of Classification Search
    None
    See application file for complete search history.

(56) References Cited

U.S. PATENT DOCUMENTS 4,046,263 A * 9/1977 Cwycyshyn ......... B23K 11/318
                                                    414/744.3
4,728,135 A * 3/1988 Sugimura ............ B25J 15/0616
                                                    294/186
(Continued)

FOREIGN PATENT DOCUMENTS

JP         8-186146       7/1996
JP       2008-141025      6/2008
(Continued)

OTHER PUBLICATIONS

International Search Report dated Dec. 27, 2016 in International (PCT) Application No. PCT/JP2016/079730.

*Primary Examiner* — Devang R Patel
(74) *Attorney, Agent, or Firm* — Wenderoth, Lind & Ponack, L.L.P.

(57) ABSTRACT

A capillary transport device is capable of inserting, without manpower, a capillary into a mounting section of an ultrasonic horn. The capillary transport device includes: a first tube for transporting a capillary; an ultrasonic horn with a mounting section for mounting the capillary; a first movement mechanism for relatively moving the ultrasonic horn and a first end of the first tube; and a mechanism for blowing gas into a second end of the first tube.

5 Claims, 12 Drawing Sheets

(52) U.S. Cl.
CPC ............ *H01L 2224/78308* (2013.01); *H01L 2224/78353* (2013.01); *H01L 2224/85205* (2013.01)

(56) References Cited

U.S. PATENT DOCUMENTS

| | | | | |
|---|---|---|---|---|
| 4,762,354 | A * | 8/1988 | Gfeller | B65G 47/91 |
| | | | | 294/2 |
| 7,975,901 | B2 * | 7/2011 | Maeda | H01L 24/78 |
| | | | | 228/180.5 |
| 8,672,210 | B2 | 3/2014 | Kim | |
| 2008/0023028 | A1 | 1/2008 | Fujita | |
| 2008/0023525 | A1 * | 1/2008 | Maeda | H01L 24/05 |
| | | | | 228/18 |
| 2012/0075079 | A1 * | 3/2012 | Takagi | G05B 19/12 |
| | | | | 340/10.51 |
| 2014/0109398 | A1 | 4/2014 | Choi | |

FOREIGN PATENT DOCUMENTS

| | | |
|---|---|---|
| JP | 2009-21493 | 1/2009 |
| JP | 2014-516213 | 7/2014 |

* cited by examiner

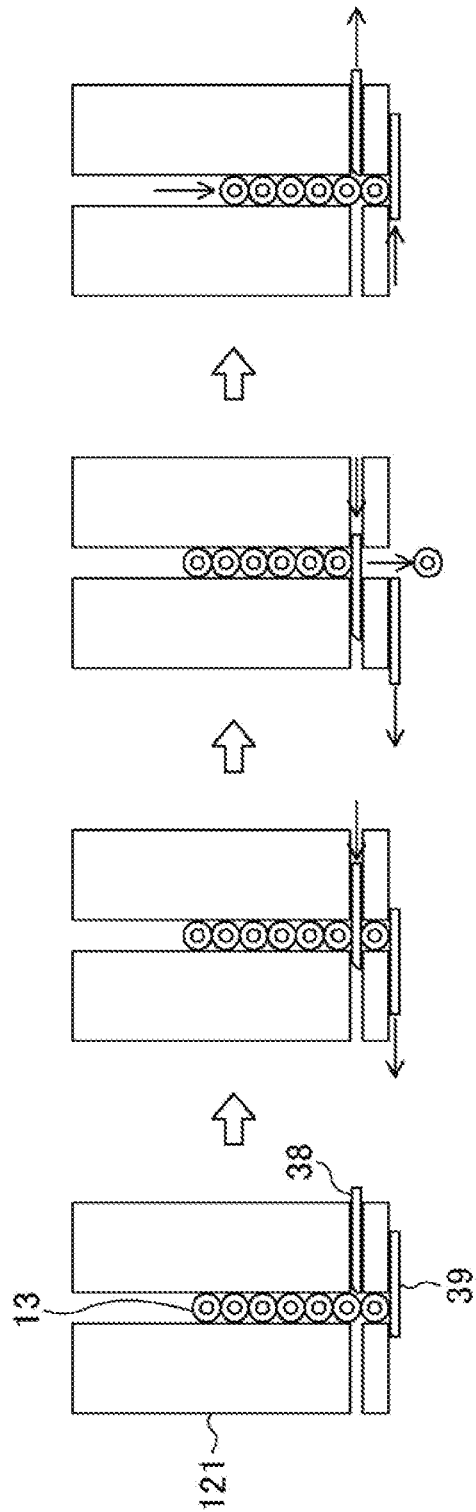

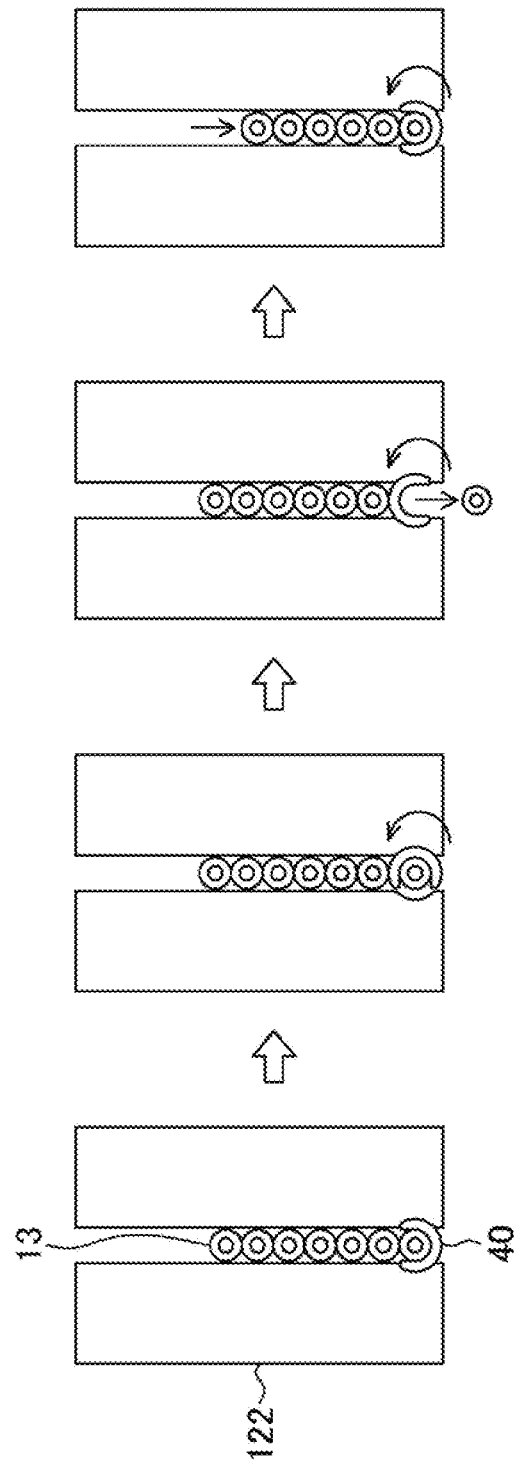

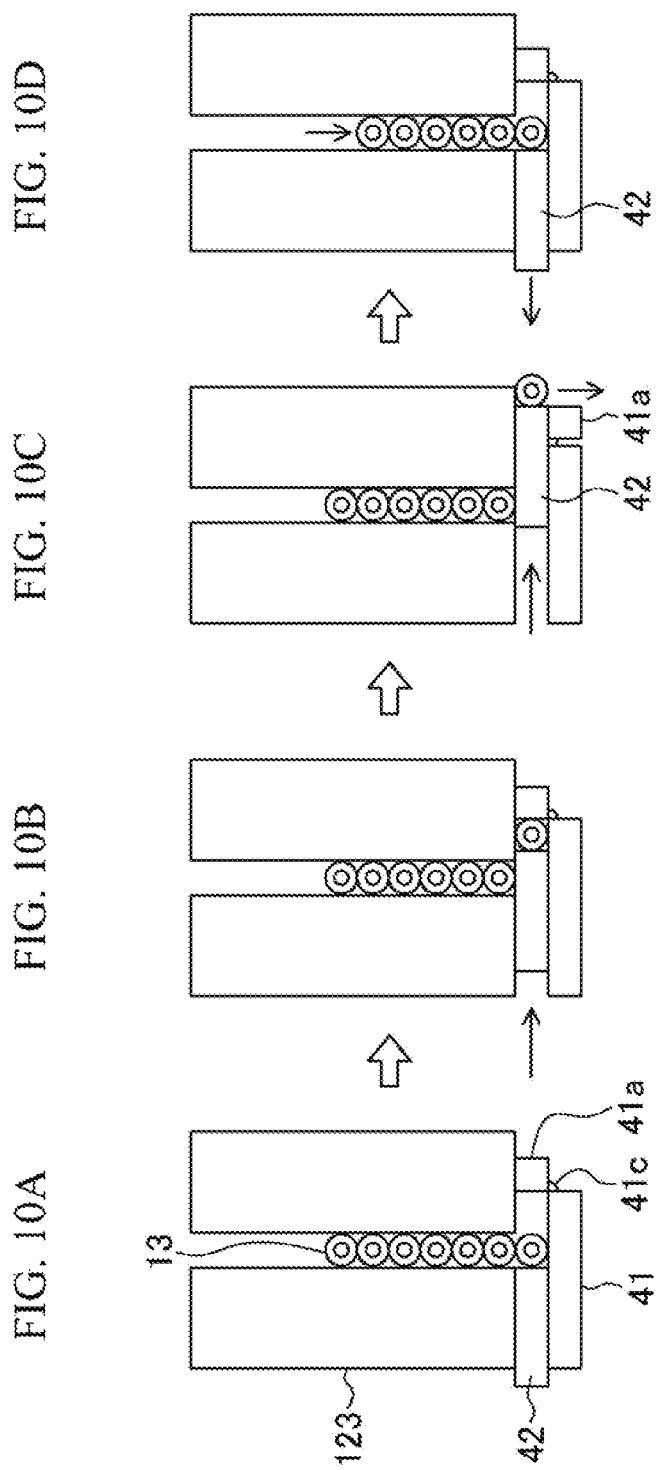

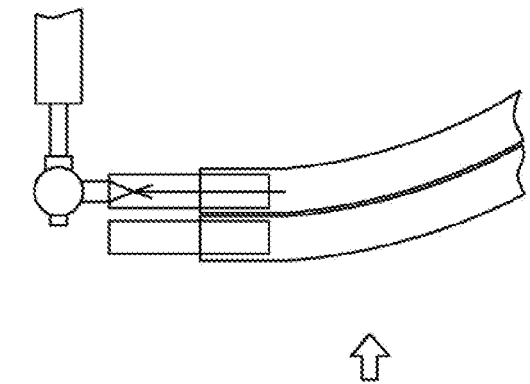
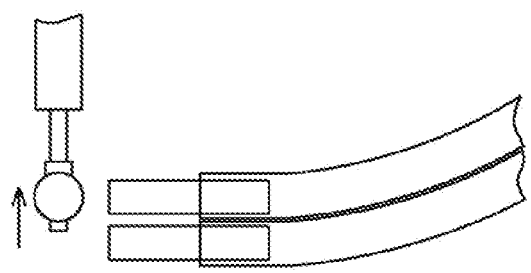
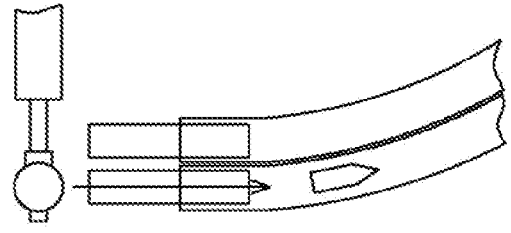
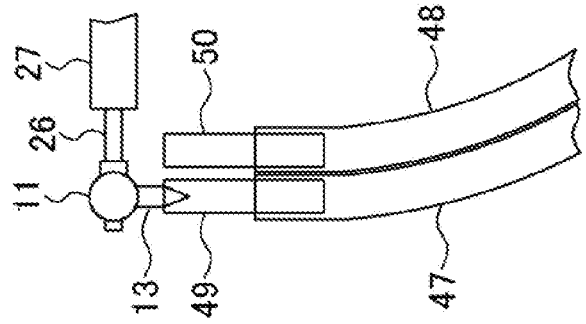

CAPILLARY TRANSPORT DEVICE, CAPILLARY MOUNTING DEVICE, CAPILLARY REPLACEMENT DEVICE, CAPILLARY TRANSPORT METHOD, CAPILLARY MOUNTING METHOD, AND CAPILLARY REPLACEMENT METHOD

TECHNICAL FIELD

The present invention relates to a capillary transport device for transporting a capillary, a capillary mounting device, a capillary replacement device, a capillary transport method, a capillary mounting method, and a capillary replacement method.

BACKGROUND ART

A wire bonding device includes a capillary for inserting a wire of gold, aluminum, copper, or the like, and is an device for electrically connecting an electrode and an electrode by the use of the wire (for example, refer to Patent Literature 1). After using a capillary a fixed number of times for bonding, the capillary is required to be replaced.

The conventional capillary replacement method will be explained.

First, there is removed a used capillary that is mounted in a capillary mounting hole of an ultrasonic horn by the use of a capillary fastening screw. Specifically, an operator holds the capillary with tweezers, and loosens fastening of the capillary fastening screw by the use of a torque driver with a bit attached thereto, and removes the used capillary from the capillary mounting hole of the ultrasonic horn.

Next, a new capillary is mounted onto the ultrasonic horn. Specifically, an operator holds the capillary with tweezers, inserts the capillary into the capillary mounting hole of the ultrasonic horn, and fastens the capillary fastening screw by a specified torque through the use of the torque driver with a bit attached thereto. In this way, the capillary is replaced.

In the above-described conventional capillary replacement method, it is difficult to insert a capillary since the diameter of the capillary mounting hole is slightly larger than the diameter of the capillary. Accordingly, there has been a case where it takes time to replace a capillary.

In addition, when an operator strongly inserts or removes a capillary in a state where the direction along which the capillary is inserted into a capillary mounting hole is slightly shifted, the capillary mounting hole may deform or a vicinity of an inlet of the capillary mounting hole may sag. Accordingly, there has been a case where the gripping state of the capillary changes, resulting in a failure in precise bonding.

Furthermore, there has been a case where, when an operator holds a capillary with tweezers, he or she drops the capillary to thereby break the tip thereof. Moreover, there has been a case where an operator may drop a capillary into a wire bonding device, and thus it takes time for him or her to remove the capillary from the inside of the device.

CITATION LIST

Patent Literature

PTL 1: Japanese Patent Laid-Open No. 2009-021493

SUMMARY OF INVENTION

Technical Problem

An aspect of the present invention is to provide any of a capillary transport device, a capillary mounting device, a capillary replacement device, a capillary transport method, a capillary mounting method, and a capillary replacement method, capable of inserting, without manpower, a capillary into a mounting section of an ultrasonic horn.

Solution to Problem

Hereinafter, various aspects of the present invention will be explained.

[1] A capillary transport device includes: a first tube for transporting a capillary; an ultrasonic horn with a mounting section for mounting the capillary; a first movement mechanism for relatively moving the ultrasonic horn and a first end of the first tube; and a mechanism for blowing gas into a second end of the first tube.

[2] In the capillary transport device according to [1], the mechanism for blowing gas includes a second tube for pushing the capillary into the second end of the first tube and a second movement mechanism for moving the second tube.

[3] The capillary transport device according to [2] further includes a block arranged at the first end of the first tube and made of a material harder than the first tube.

[4] A capillary mounting device includes the capillary transport device according to any one of [1] to [3] and a mechanism for fixing the capillary to the mounting section.

[5] A capillary replacement device includes the capillary mounting device according to [4], a mechanism for removing the capillary fixed to the mounting section, and a mechanism for sucking gas from the second end of the first tube.

[6] A capillary replacement device includes: a fourth tube for transporting a first capillary; a first tube for transporting a second capillary; an ultrasonic horn with a mounting section for mounting the first or second capillary; a first movement mechanism for relatively moving the ultrasonic horn and a first end of the first tube as well as a first end of the fourth tube; a mechanism for blowing gas into a second end of the first tube; a mechanism for sucking gas from a second end of the fourth tube; a mechanism for removing the first capillary fixed to the mounting section; and a mechanism for fixing the second capillary to the mounting section.

[7] A capillary replacement device includes: a first tube including a first path for transporting a first capillary, a second path for transporting a second capillary, and a third path where the first path and the second path are merged; an ultrasonic horn with a mounting section for mounting the first or second capillary; a first movement mechanism for relatively moving the ultrasonic horn and an end of the third path of the first tube; a mechanism for blowing gas into an end of the second path of the first tube; a mechanism for removing the first capillary fixed to the mounting section; and a mechanism for fixing the second capillary to the mounting section.

[8] A capillary transport method includes the steps of: relatively moving an ultrasonic horn and a first end of a first tube to thereby align a mounting section of the ultrasonic horn and the first end of the first tube; inserting a capillary from a second end of the first tube into the first tube; and transporting the capillary from the second end of the first tube to the mounting section of the ultrasonic horn through the first end, by blowing gas into the second end of the first tube.

[9] A capillary mounting method includes the steps of: transporting the capillary to the mounting section of the ultrasonic horn by using the capillary transport method according to [8]; and fixing the capillary to the mounting section.

[10] A capillary replacement method includes the steps of: relatively moving an ultrasonic horn with a first capillary fixed to a mounting section thereof and a first end of a first tube to thereby insert the first capillary into the first end of the first tube; removing, from the ultrasonic horn, the first capillary fixed to the mounting section; transporting the first capillary to the second end from the first end of the first tube by sucking gas from the second end of the first tube to thereby eject the first capillary from the first tube; inserting a second capillary into the first tube from the second end of the first tube; transporting the second capillary from the second end of the first tube to the mounting section of the ultrasonic horn through the first end, by blowing gas into the second end of the first tube; and fixing the second capillary to the mounting section.

Advantageous Effects of Invention

According to one aspect of the present invention, there is provided either one of a capillary transport device, a capillary mounting device, a capillary replacement device, a capillary transport method, a capillary mounting method, and a capillary replacement method, capable of inserting, without manpower, a capillary into a mounting section of an ultrasonic horn.

BRIEF DESCRIPTION OF DRAWINGS

FIG. 7A is a perspective view obtained by enlarging the tip side of the ultrasonic horn illustrated in FIG. 1, while

FIGS. 8A to 8D are cross-sectional views illustrating a capillary cartridge of a capillary interchange unit according to one aspect of the present invention.

FIGS. 9A to 9D are cross-sectional views illustrating a capillary cartridge of a capillary interchange unit according to one aspect of the present invention.

FIGS. 10A to 10D are cross-sectional views illustrating a capillary cartridge of a capillary interchange unit according to one aspect of the present invention.

FIGS. 12A to 12D are schematic views illustrating the path tube and screw fastening unit of a capillary replacement device according to one aspect of the present invention.

DESCRIPTION OF EMBODIMENTS

Hereinafter, embodiments of the present invention will be explained in detail by the use of the drawings. However, a person skilled in the art would easily understand that the present invention is not limited to the following explanation but the form and details thereof can be variously changed without deviating from the gist and the scope of the present invention. Accordingly, the present invention should not be construed as being limited to the description of the embodiments shown below.

First Embodiment

Figure 1:
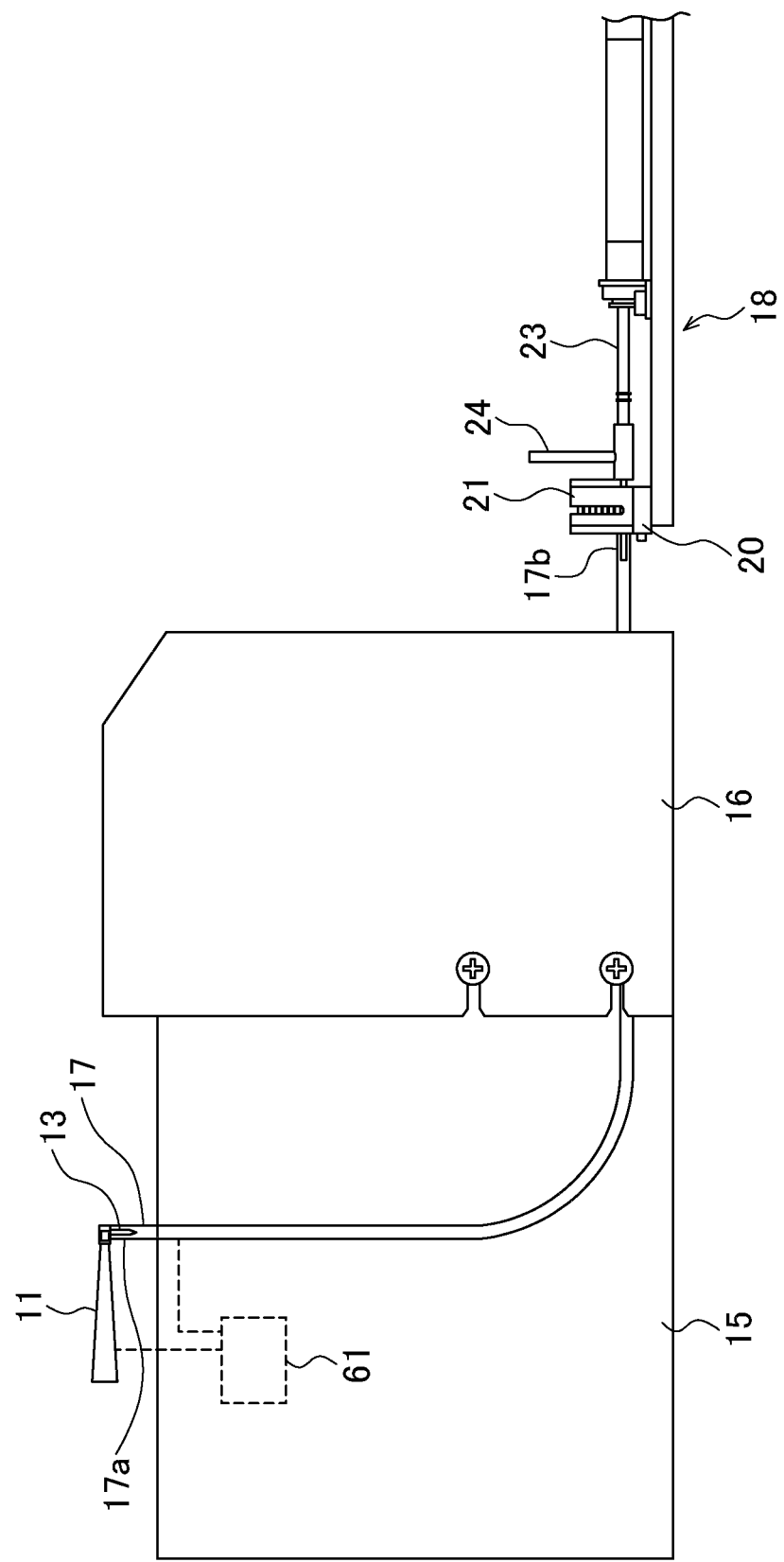
FIG. 1 is a schematic view illustrating a wire bonding device according to one aspect of the present invention.
Figure 7A:
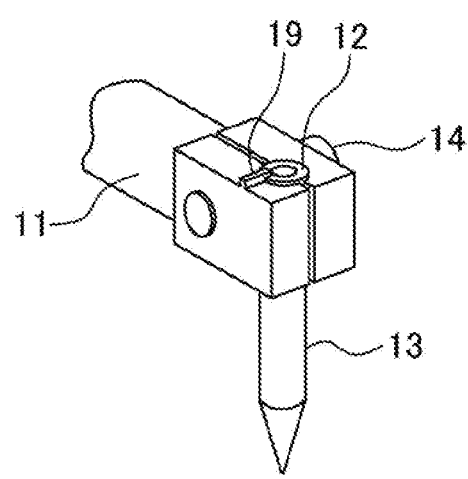

FIG. 1 is a schematic view illustrating a wire bonding device according to one aspect of the present invention. FIG. 7A is a perspective view obtained by enlarging the tip side of an ultrasonic horn illustrated in FIG. 1.

As illustrated in FIG. 1 and FIG. 7, the wire bonding device includes an ultrasonic horn 11, and a capillary 13 is mounted in a capillary mounting hole (also referred to as a mounting section) 12 of the ultrasonic horn 11 by the use of a capillary fastening screw 14. A wire (not illustrated) is inserted into the capillary 13 and the capillary 13 is moved together with the ultrasonic horn 11 by the use of a movement mechanism 61 (also referred to as a first movement mechanism), and thus an electrode and an electrode can be electrically connected by the use of this wire. A stopper 19 integrated with the ultrasonic horn 11 is provided in the upper surface of the ultrasonic horn 11.

As illustrated in FIG. 1, the wire bonding device includes a carrier 15 and a carrier cover 16, and a mechanism 61 required for the wire bonding device is arranged inside the carrier 15 and carrier cover 16. A path tube 17 (also referred to as a first tube) has the capillary 13 of the ultrasonic horn 11 inserted into a first end 17a. The path tube 17 is a tube for transporting the capillary 13, and the inner diameter of the path tube 17 is set to a size for allowing easy transportation of the capillary 13. The inner diameter of the path tube 17 is, for example, 2.0 mm, and the outer diameter (diameter of the thickest part) of the capillary is, for example, 1.58 mm. A second end 17b of the path tube 17 is connected to a capillary interchange unit 18.

Figure 2:
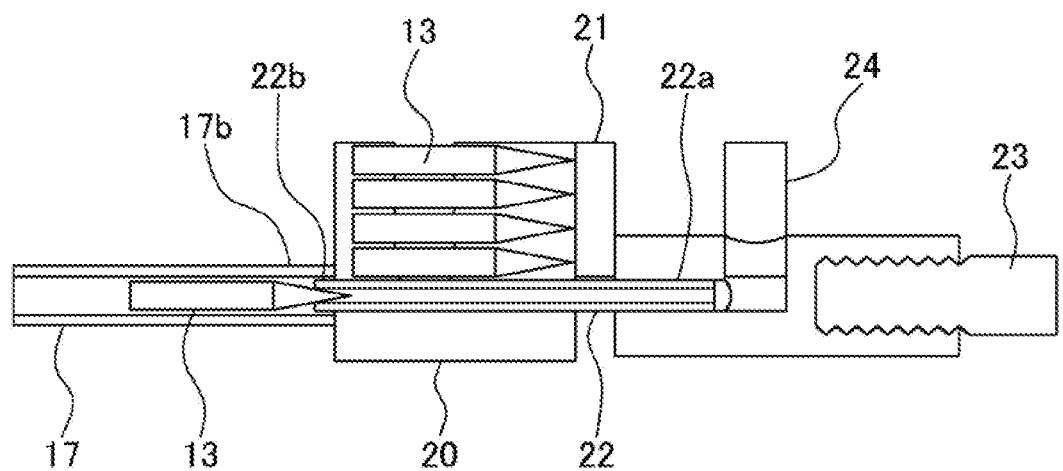
FIG. 2 is a schematic view obtained by enlarging a capillary interchange unit 18 illustrated in FIG. 1.

FIG. 2 is a schematic view obtained by enlarging the capillary interchange unit 18 illustrated in FIG. 1. The capillary interchange unit 18 includes a stand 20 and a capillary cartridge 21 (also referred to as a container) for vertically stacking and housing the capillaries 13 for replacement arranged above the stand. The second end 17b of the path tube 17 is connected between the stand 20 and the capillary cartridge 21.

Furthermore, the capillary interchange unit 18 includes: a mechanism for blowing gas (for example, air) into the second end 17b of the path tube 17. This gas blowing mechanism includes a capillary extrusion pipe 22 (also referred to as a second tube) for pushing the capillary 13 into the second end 17b of the path tube 17; and an air cylinder 23 as a second movement mechanism for moving the capillary extrusion pipe 22.

Moreover, the mechanism for blowing gas includes a gas injection/suction tube 24, which is connected to a first end 22a of the capillary extrusion pipe 22. Accordingly, the gas injected from the gas injection/suction tube 24 is to be blown into the second end 17b of the path tube 17 through the capillary extrusion pipe 22.

In addition, the mechanism for sucking gas includes the gas injection/suction tube 24, which is connected to the first end 22a of the capillary extrusion pipe 22. Accordingly, in a state where a second end 22b of the capillary extrusion pipe 22 is connected to the second end 17b of the path tube 17, the gas is sucked from the gas injection/suction tube 24, and thus the gas inside the tube 17 can be sucked from the second end 17b of the path tube 17.

The outer diameter of the capillary extrusion pipe 22 is smaller than the inner diameter of the path tube 17. Therefore, the capillary 13 can be inserted into the path tube 17 by pushing the capillary extrusion pipe 22, together with the capillaries 13 for replacement positioned above the stand 20, into the second end 17b of the path tube 17 by the use of the air cylinder 23. Note that the outer diameter of the capillary extrusion pipe 22 is, for example, 1.5 mm. Accordingly, the outer diameter of the capillary extrusion pipe 22 is smaller than the outer diameter of the capillary 13.

Figure 3:
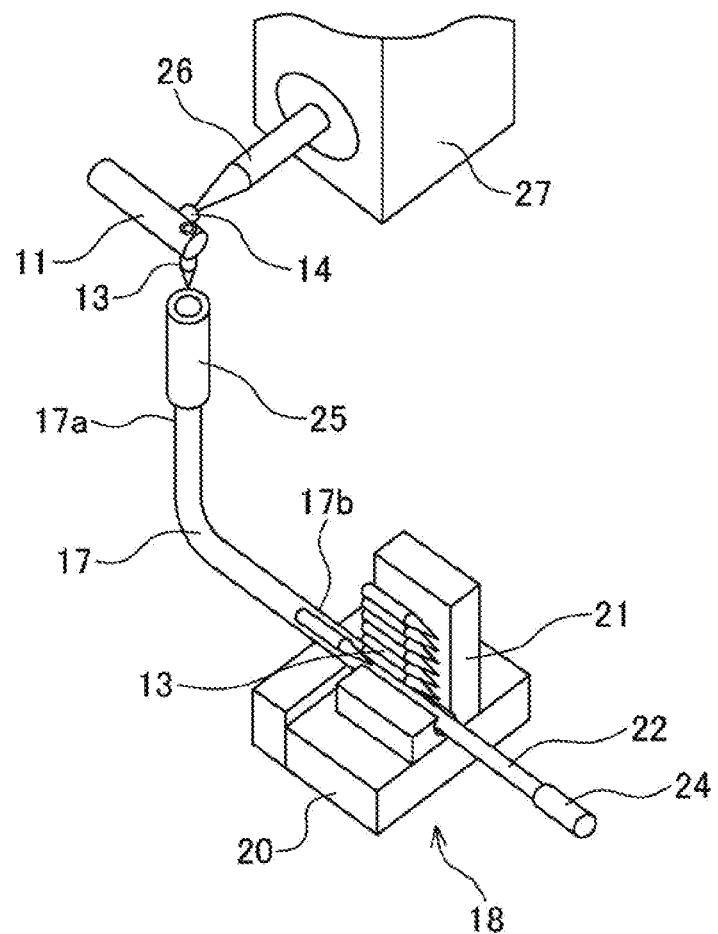
FIG. 3 is a perspective view illustrating the capillary replacement device according to one aspect of the present invention.

FIG. 3 is a perspective view illustrating the capillary replacement device according to one aspect of the present invention. The capillary interchange unit 18, path tube 17, and ultrasonic horn 11 of the capillary replacement device illustrated in FIG. 3 are similar to those illustrated in FIG. 1 and FIG. 2.

At the first end 17a of the path tube 17, there is arranged a horn pressing pipe 25 (also referred to as a block), which is preferably made of a material harder than that of the path tube 17. Accordingly, in pressing the pipe 25 against the ultrasonic horn 11, it is possible to reliably perform a positional alignment and to thereby suppress a positional displacement of the pipe 25. Note that, in this embodiment, the horn pressing pipe 25 in the shape of a tube is used, but not limited to a tubular one, and may be a block if the pipe is capable of suppressing a positional displacement, instead of being the tubular one.

In addition, the capillary replacement device includes a movement mechanism 61 (also referred to as a first movement mechanism) for moving the first end 17a of the path tube 17. By moving the first end 17a of the path tube 17 through the use of this movement mechanism, it is possible to insert the used capillary 13 into the horn pressing pipe 25 or the first end 17a of the path tube 17. By using the horn pressing pipe 25 made of a material harder than that of the path tube 17, it is possible to suppress deformation of the pipe 25 in pressing the pipe 25 against the ultrasonic horn 11 as compared with a case of pressing the first end 17a of the path tube 17 against the ultrasonic horn 11. Note that the movement mechanism is, for example, an air cylinder, and is controlled by a control section (not illustrated).

Furthermore, the first end 17a of the path tube 17 is not moved, but the ultrasonic horn 11 is moved through the use of a movement mechanism, and thereby the used capillary 13 may be inserted into the horn pressing pipe 25 or the first end 17a of the path tube 17.

The ultrasonic horn 11 is provided with a capillary mounting hole in which the capillary 13 is mounted, and the capillary 13 is to be mounted in the capillary mounting hole through the use of the capillary fastening screw 14.

Furthermore, the capillary replacement device includes, as a mechanism for fixing the capillary 13 to the capillary mounting hole, a screw fastening unit 27 that fastens by a torque driver or by the rotation of a motor. This screw fastening unit 27 functions also as a mechanism for removing the capillary 13 fixed to the capillary mounting hole. Specifically, the capillary 13 is mounted in the capillary mounting hole of the ultrasonic horn 11 by inserting the capillary 13 into the capillary mounting hole of the ultrasonic horn and fastening the capillary fastening screw 14 by a specified torque through the use of the screw fastening unit 27 with a bit 26 attached thereto. Moreover, the capillary 13 is removed from the capillary mounting hole of the ultrasonic horn 11 by loosening, through the use of the screw fastening unit 27 with the bit 26 attached thereto, the fastening of the capillary fastening screw 14 fixing the capillary 13 to the capillary mounting hole of the ultrasonic horn 11. Note that the screw fastening unit 27 that fastens by a torque driver or by the rotation of a motor is controlled by the control section.

FIGS. 4A to 4D illustrate a method for removing a used capillary from an ultrasonic horn according to one aspect of the present invention.

Figure 4A:
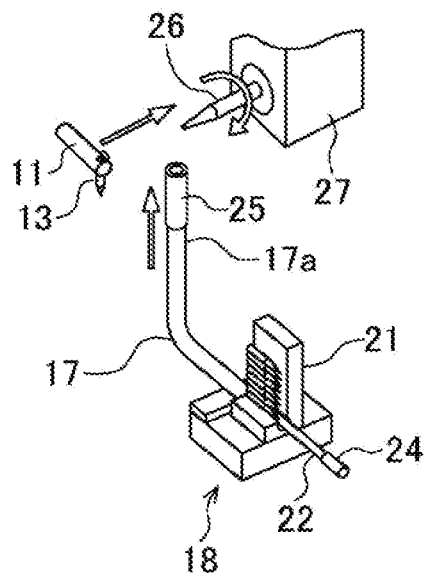
FIGS. 4A to 4D are diagrams illustrating a method for removing a used capillary from an ultrasonic horn according to one aspect of the present invention.

As illustrated in FIG. 4A, the capillary mounting hole of the ultrasonic horn 11 and the first end 17a of the path tube 17 are position-aligned by relatively moving the ultrasonic horn 11 and the first end 17a of the path tube 17. Specifically, the ultrasonic horn 11 is moved to directly above the horn pressing pipe 25, as illustrated by an arrow, through the use of a movement mechanism while slowly turning the bit 26, and then the bit 26 is fitted into a hexagon socket of the capillary fastening screw 14. Subsequently, the horn pressing pipe 25 together with the first end 17a of the path tube 17 is moved upward, as indicated by an arrow, through the use of the air cylinder, and then as illustrated in FIG. 4B, the capillary 13 is inserted into the horn pressing pipe 25 or the first end 17a and is completely wrapped.

Note that, in the present embodiment, the horn pressing pipe 25 is moved upward while the ultrasonic horn 11 is fixed directly above the horn pressing pipe 25, but the ultrasonic horn 11 may be moved downward while the horn pressing pipe 25 is fixed. Furthermore, when a flexible tube is used for the path tube 17, the bending angle of the path tube 17 just slightly changes even if the horn pressing pipe 25 is moved in the vertical direction, and thus the horn pressing pipe 25 can be vertically moved with smaller force. The bit 26 and screw fastening unit 27 may be fixed and installed at a position where a bonding operation is not disturbed or may be installed so as to be able to be horizontally moved by a movement mechanism.

Next, the capillary fastening screw 14 is loosened by turning the bit 26. Subsequently, once gas (air) is sucked from the gas injection/suction tube 24 in a state illustrated in FIG. 4B, the capillary 13 (also referred to as a first capillary) is removed from the capillary mounting hole of the ultrasonic horn 11 and is sucked to the second end 22b of the capillary extrusion pipe 22, through the second end 17b from the first end 17a of the path tube 17 (refer to FIG. 2). This is because the inner diameter of the capillary extrusion pipe 22 is smaller than the outer diameter of the capillary 13.

Figure 4C:
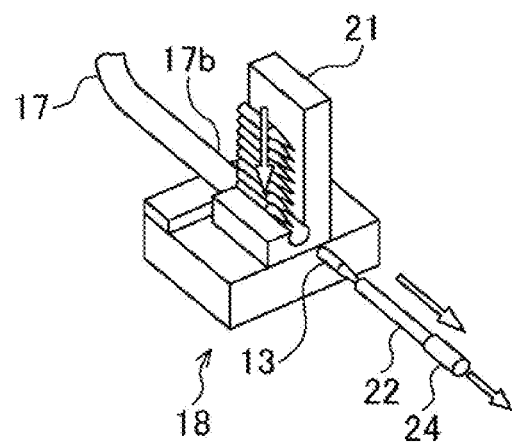
Figure 4B:
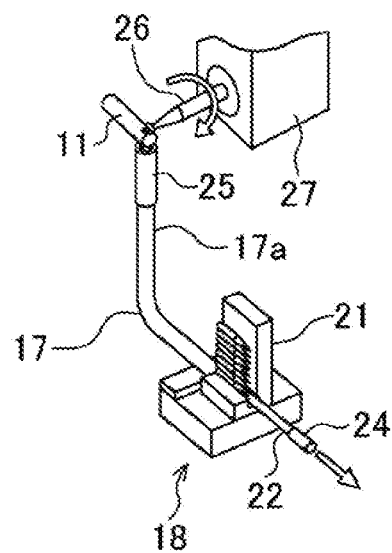

Next, as illustrated in FIG. 4C, the capillary 13 and the capillary extrusion pipe 22 are moved to the outside of the capillary cartridge 21, by moving the capillary extrusion pipe having the capillary 13 sucked thereinto and the gas injection/suction tube 24, as indicated by an arrow, through the use of the air cylinder 23. Accordingly, the capillary 13 inside the capillary cartridge 21 drops downwards, the capillary 13 for replacement is set above the stand 20, and the used capillary 13 is ejected to the outside of the capillary cartridge 21.

Figure 4D:
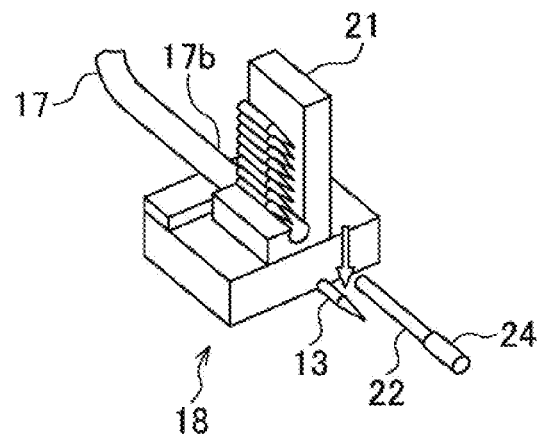

Subsequently, as illustrated in FIG. 4D, once the suction of air from the gas injection/suction tube 24 is stopped, the capillary 13 sucked to the capillary extrusion pipe 22 drops. In this way, the operation of removing the capillary 13 from the ultrasonic horn 11 is completed.

FIGS. 5A to 5D illustrate a method for mounting a capillary for replacement onto the ultrasonic horn according to one aspect of the present invention.

Figure 5A:
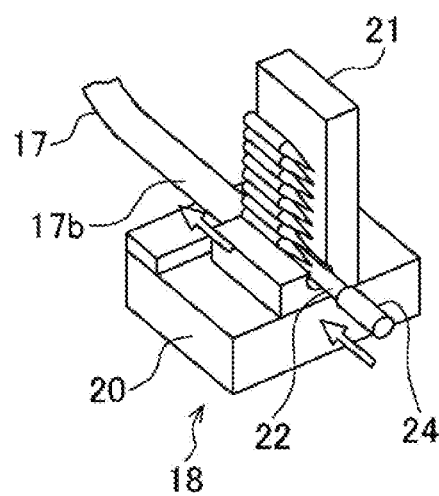
FIGS. 5A to 5D are diagrams illustrating a method for mounting a capillary for replacement onto the ultrasonic horn according to one aspect of the present invention.

As illustrated in FIG. 5A, the capillary extrusion pipe 22 and gas injection/suction tube 24 are moved, as indicated by an arrow, through the use of the air cylinder 23, and thus the capillary extrusion pipe 22 pushes the capillary 13 above the stand 20 and inserts the capillary 13 into the second end 17b of the path tube 17.

Figure 5B:
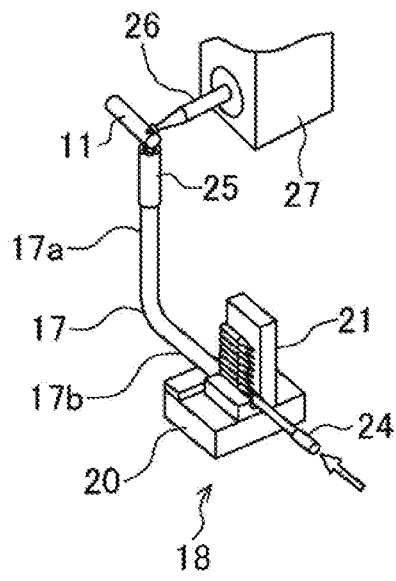

Next, as illustrated in FIG. 5B, once gas (air) is injected from the gas injection/suction tube 24, the air is blown into the second end 17b of the path tube 17 and the capillary 13 is transported to the capillary mounting hole of the ultrasonic horn 11 through the first end 17a from the second end 17b of the path tube 17. Namely, since the injected air passes through the capillary mounting hole from the horn pressing pipe 25, the capillary 13 pushed by the air is also guided into the capillary mounting hole along the flow of the air. The capillary 13 can be inserted into the capillary mounting hole without damaging the ultrasonic horn 11, by adjusting the pressure of the air and the inner diameter of the path tube 17. Once the capillary 13 is transported to the capillary mounting hole, the capillary 13 is stopped at a predetermined position by the stopper 19 (refer to FIG. 7A).

Figure 7B:
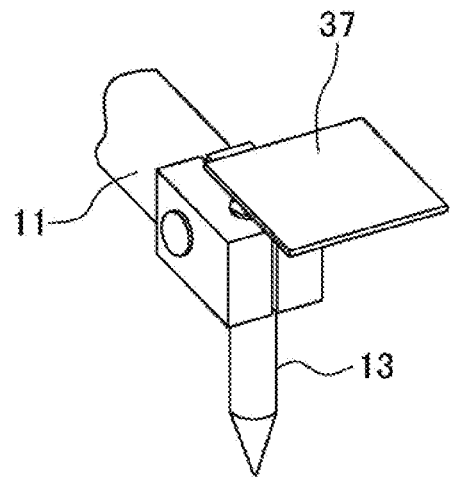
FIG. 7B illustrates a modification of the ultrasonic horn illustrated in FIG. 7A.

Note that, in this embodiment, as illustrated in FIG. 7A, the stopper 19 integrated with the ultrasonic horn 11 is provided at the upper surface of the ultrasonic horn 11, but as illustrated in FIG. 7B, an impact sensing sensor 37 may be provided on the upper surface of the ultrasonic horn 11. Accordingly, once the capillary 13 is transported to the capillary mounting hole, the impact is sensed by the impact sensing sensor 37 and the capillary 13 stops at a predetermined position. Accordingly, insertion of the capillary 13 into the capillary mounting hole can be reliably detected.

Figure 5C:
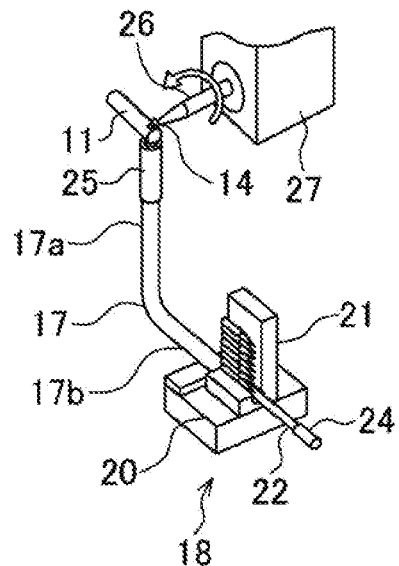

Next, as illustrated in FIG. 5C, the capillary 13 is fixed and mounted in the capillary mounting hole of the ultrasonic horn 11 with stable grip force, by turning the bit 26, as indicated by an arrow, with the screw fastening unit 27 and fastening the capillary fastening screw 14 by a specified torque.

Figure 5D:
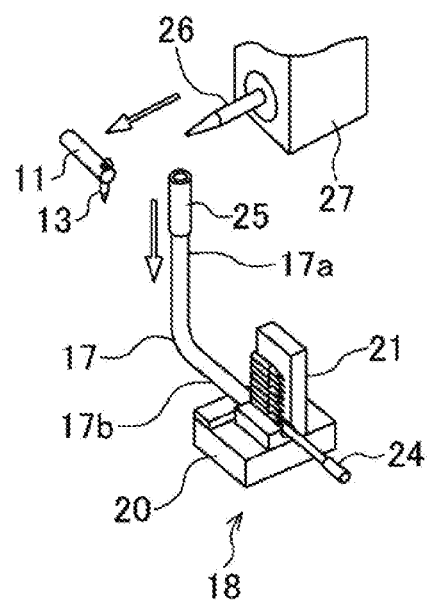

Then, as illustrated in FIG. 5D, the horn pressing pipe 25 together with the first end 17a of the path tube 17 is moved downward, as indicated by an arrow, by the use of the air cylinder and the ultrasonic horn 11 is separated from the bit 26, as indicated by an arrow, by the use of the movement mechanism. In this way, the operation of mounting the capillary 13 onto the ultrasonic horn 11 is completed.

According to this embodiment, the capillary 13 can be inserted into the capillary mounting hole of the ultrasonic horn 11 without manpower.

Furthermore, in this embodiment, a path can be freely changed to some extent by the use of a flexible material for the path tube 17, and thus there is no problem in finding an installation place of the path tube 17. In addition, the capillary 13 does not drop and a capillary replacement work can be stably and quickly finished.

Moreover, since the capillary 13 is inserted into the capillary mounting hole of the ultrasonic horn 11 by blowing out air from the gas injection/suction tube 24, a force applied to the ultrasonic horn 11 can be made small and thus the ultrasonic horn 11 can be prevented from deforming.

In addition, since the capillary 13 reaches the ultrasonic horn 11 through the path tube 17, there is no need to pinch the capillary 13 with tweezers unlike in the conventional technique, and the capillary 13 is not dropped. Moreover, the capillary fastening screw 14 is turned by a predetermined torque by the use of the screw fastening unit 27 while the angle and turning speed of the bit are set to be the same, and thus a variation in the fastening force can be reduced. In addition, since the capillary 13 can be automatically replaced without manpower, the work amount of an operator decreases and the time for the capillary replacement work can be reduced.

Note that, in this embodiment, as the mechanism for fixing the capillary 13 to the ultrasonic horn 11, the capillary 13 is inserted into the capillary mounting hole 12 of the ultrasonic horn 11 and is fixed by the use of the capillary fastening screw 14, but not limited to such a fixing method, and another fixing method may be used and the fixing can also be carried out by, for example, pinching of the capillary 13.

Second Embodiment

Figure 6A:
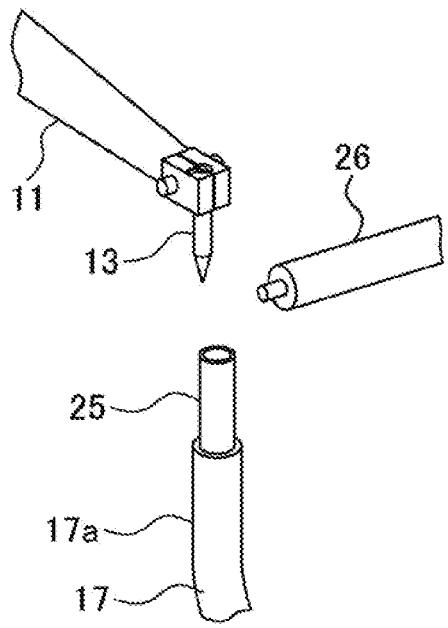
FIGS. 6A to 6C are diagrams illustrating a method for removing a used capillary from an ultrasonic horn according to one aspect of the present invention.
Figure 6C:
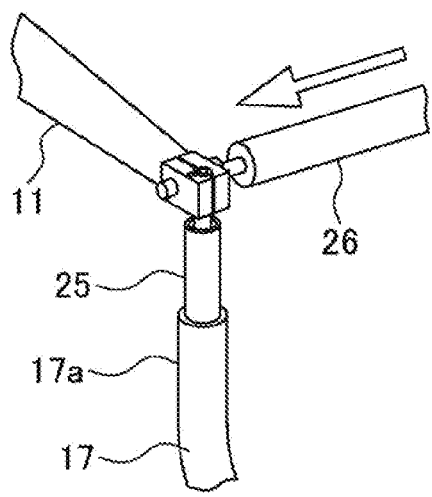
Figure 6B:
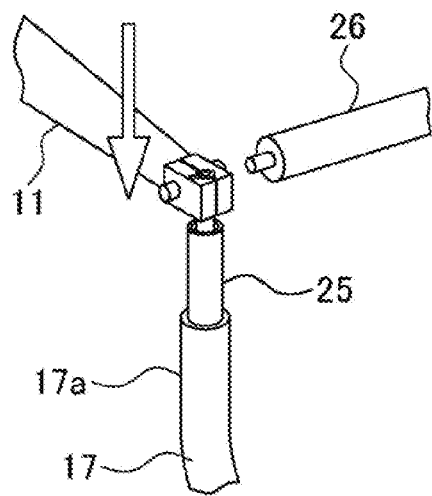

FIGS. 6A to 6C illustrate a method for removing a used capillary from an ultrasonic horn according to one aspect of the present invention. Here, the same reference sign is attached to the same part as that of FIG. 4 and only a different part will be explained.

As illustrated in FIG. 6A, the horn pressing pipe 25 is fixed to and installed on the bonding device. The capillary mounting hole of the ultrasonic horn 11 and the first end 17a of the path tube 17 are aligned by moving the ultrasonic horn 11. Specifically, the ultrasonic horn 11 is moved to directly above the horn pressing pipe 25 by the use of a movement mechanism. Subsequently, as illustrated in FIG. 6B, the tip of the ultrasonic horn 11 is moved downward as indicated by an arrow, and the capillary 13 is inserted into the horn pressing pipe 25 or the first end 17a.

Next, as illustrated in FIG. 6C, the screw fastening unit is moved as indicated by an arrow (in the X direction), the bit 26 is inserted into a hexagon socket of the capillary fastening screw, and the bit 26 is turned to loosen the capillary fastening screw. Accordingly, gripping of the capillary 13 in the capillary mounting hole of the ultrasonic horn 11 is released. The subsequent operation of removing the capillary 13 from the ultrasonic horn 11 is similar to that of the first embodiment.

Furthermore, in mounting a capillary for replacement onto the ultrasonic horn 11, the operations in the order reverse to the order of the operations of the FIGS. 6A to 6C may be performed, and other operations except for the operations are similar to those of the first embodiment.

Also in this embodiment, the similar effect to that of the first embodiment can be obtained.

Third Embodiment

FIGS. 8A to 8D are cross-sectional views illustrating a capillary cartridge of a capillary interchange unit according to one aspect of the present invention. Here, the same reference sign is attached to the same part as that of FIG. 2 and only a different part will be explained.

A capillary cartridge 121 has a space. The second end 17b of the path tube 17 illustrated in FIG. 2 is connected to one side of the space, whereas the gas injection/suction tube 24 illustrated in FIG. 2 is connected to the other side of the space. The capillaries 13 are vertically stacked one by one in the space of the capillary cartridge 121. A slide plate 39 for holding a capillary filled at the bottom of the space is mounted on the capillary cartridge 121, while a slide plate 38 for holding a capillary directly above the capillary filled at the bottom of the space is mounted on the capillary cartridge 121.

In mounting a capillary for replacement onto the ultrasonic horn, as illustrated in FIG. 8A, the capillaries 13 are filled on the slide plate 39 of the capillary cartridge 121.

Next, as illustrated in FIG. 8B, the slide plate 38 is moved as indicated by an arrow, to thereby position, on the slide plate 38, the capillary 13 directly above the capillary 13 on the slide plate 39. Next, once gas (air) is injected from the gas injection/suction tube 24, the capillary 13 between the slide plate 39 and slide 38 is transported to the capillary mounting hole of the ultrasonic horn 11 through the first end 17a from the second end 17b of the path tube 17. The subsequent operation is similar to that of the first embodiment.

In removing a used capillary from the ultrasonic horn, the operation similar to that of the first embodiment is performed. Once gas (air) is sucked from the gas injection/suction tube 24, the capillary 13 is removed from the capillary mounting hole of the ultrasonic horn 11 and is positioned between the slide plate 39 and slide plate 38 through the second end 17b from the first end 17a of the path tube 17 (refer to FIG. 8B). Next, as illustrated in FIG. 8C, the capillary 13 drops by moving the slide plate 39 as indicated by an arrow. In this way, the used capillary 13 is ejected.

Subsequently, as illustrated in FIG. 8D, the capillaries 13 are filled on the slide plate 39 by moving the slide plate 39 and slide plate 38 as indicated by an arrow.

Also in this embodiment, the similar effect to that of the first embodiment can be obtained.

Fourth Embodiment

FIGS. 9A to 9D are cross-sectional views illustrating a capillary cartridge of a capillary interchange unit according to one aspect of the present invention. Here, the same reference sign is attached to the same part as that of FIG. 2 and only a different part will be explained.

A capillary cartridge 122 has a space. The second end 17b of the path tube 17 illustrated in FIG. 2 is connected to one side of the space, whereas the gas injection/suction tube 24 illustrated in FIG. 2 is connected to the other side of the space. The capillaries 13 are vertically stacked one by one in the space of the capillary cartridge 122, and a holding member 40 for holding the capillary filled at the bottom of the space is mounted on the capillary cartridge 122.

In mounting a capillary for replacement onto the ultrasonic horn, as illustrated in FIG. 9A, the holding member 40 of the capillary cartridge 122 is filled with the capillaries 13. Next, as illustrated in FIG. 9B, the holding member 40 is rotated, as indicated by an arrow, and the capillary 13 held by the holding member 40 and the capillary 13 positioned directly above the capillary 13 are separated. Next, once gas (air) is injected from the gas injection/suction tube 24, the capillary 13 between the slide plate 39 and slide plate 38 is transported to the capillary mounting hole of the ultrasonic horn 11 through the first end 17a from the second end 17b of the path tube 17. The subsequent operation is similar to that of the first embodiment.

In removing a used capillary from the ultrasonic horn, the operation similar to that of the first embodiment is performed. Once gas (air) is sucked from the gas injection/suction tube 24, the capillary 13 is removed from the capillary mounting hole of the ultrasonic horn 11, and is held by the holding member 40 of the capillary cartridge 122 through the second end 17b from the first end 17a of the path tube 17 (refer to FIG. 9B). Next, as illustrated in FIG. 9C, the capillary 13 drops by rotation of the holding member 40 as indicated by an arrow. In this way, the used capillary 13 is ejected.

Subsequently, as illustrated in FIG. 9D, the holding member 40 is filled with the capillaries 13 by rotation of the holding member 40 as indicated by an arrow.

Also in this embodiment, the similar effect to that of the first embodiment can be obtained.

Fifth Embodiment

FIGS. 10A to 10D are cross-sectional views each illustrating a capillary cartridge of a capillary interchange unit according to one aspect of the present invention. Here, the same reference sign is attached to the same part as that of FIG. 2 and only a different part will be explained.

A capillary cartridge 123 has a space. The second end 17b of the path tube 17 illustrated in FIG. 2 is connected to one side of the space, whereas the gas injection/suction tube 24 illustrated in FIG. 2 is connected to the other side of the space. The capillaries 13 are vertically stacked one by one in the space of the capillary cartridge 123, and a holding stand 41 for holding the capillary filled at the bottom of the space is mounted to the capillary cartridge 123. A slide plate 42 is mounted on the capillary cartridge 123, above the holding stand 41. At one end of the holding stand 41, a member 41a is mounted on the holding stand 41 by the use of a return mechanism 41c such as a spring hinge. This return mechanism 41c is a mechanism for: fixing the member 41a to a position illustrated in FIG. 10A in a state where a force is not applied to the member 41a; rotating the members 41a by 90° when a force in the direction of an arrow illustrated in FIG. 10C is applied to the member 41a by the slide plate 42; and returning the member 41a to the position illustrated in FIG. 10D when the force is no longer applied.

In mounting a capillary for replacement onto the ultrasonic horn, as illustrated in FIG. 10A, the capillaries 13 are filled on the holding stand 41 by putting the slide plate 42 into a state of not being positioned below the space of the capillary cartridge 123 having the capillaries 13 stacked therein. Next, as illustrated in FIG. 10B, the slide plate 42 is moved as indicated by an arrow, and the filled capillaries 13 are arranged at a predetermined position. Next, once gas (air) is injected from the gas injection/suction tube 24, the capillary 13 between the slide plate 42 and member 41a is transported to the capillary mounting hole of the ultrasonic horn 11 through the first end 17a from the second end 17b of the path tube 17. The subsequent operation is freely that of the first embodiment.

In removing a used capillary from the ultrasonic horn, the operation similar to that of the first embodiment is performed. Once gas (air) is sucked from the gas injection/suction tube 24, the capillary 13 is removed from the capillary mounting hole of the ultrasonic horn 11 and is positioned between the slide plate 42 and the member 41a through the second end 17b from the first end 17a of the path tube 17 (refer to FIG. 10B). Next, as illustrated in FIG. 10C, the capillary 13 drops by moving the slide plate 42 as indicated by an arrow. In this way, the used capillary 13 is ejected.

Subsequently, as illustrated in FIG. 10D, the capillaries 13 are filled on the holding stand 41 by moving the slide plate 42 as indicated by an arrow. At this time, the member 41a returns to the original position by the force of a spring of the return mechanism 41c.

Also in this embodiment, the similar effect to that of the first embodiment can be obtained.

Sixth Embodiment

Figure 11A:
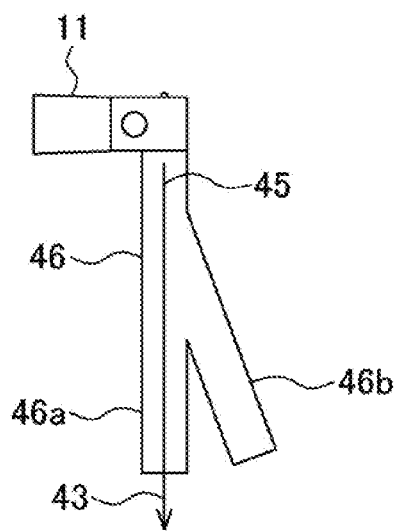
FIGS. 11A and 11B are the cross-sectional views illustrating a path tube of a capillary replacement device according to one aspect of the present invention.
Figure 11B:
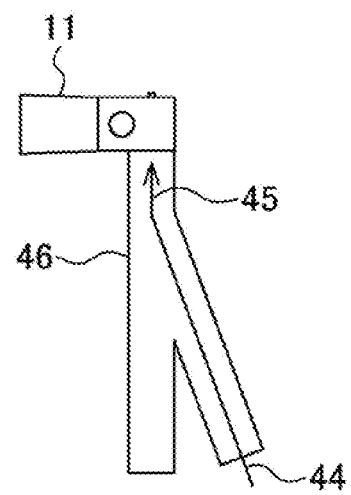

FIGS. 11A and 11B are the cross-sectional views illustrating a path tube of a capillary replacement device according to one aspect of the present invention. Here, the same reference sign is attached to the same part as each of those of FIG. 3 to FIG. 5 and only a different part will be explained.

A path tube 46 includes an ejection tube 46a provided with a first path for transporting a capillary for replacement and an injection tube 46b provided with a second path for transporting a capillary for replacement. The path tube 46 includes a third path 45 where the first path and the second path are merged.

At an end of the third path 45 of the path tube 46, a non-illustrated horn pressing pipe (also referred to as a block) is arranged. Furthermore, the capillary replacement device includes a non-illustrated movement mechanism (also referred to as a first movement mechanism) for moving the end of the third path 45 of the path tube 46. A used capillary can be inserted into the horn pressing pipe or the end of the third path 45 of the path tube 46, by moving the end of the third path 45 of the path tube 46 by the use of this movement mechanism. By the use of the horn pressing pipe made of a material harder than that of the path tube 46, deformation of the horn pressing pipe can be suppressed in pressing the horn pressing pipe against the ultrasonic horn 11, as compared with a case where the end of the third path 45 of the path tube 46 is pressed against the ultrasonic horn 11.

Moreover, a used capillary may be inserted into the horn pressing pipe or the end of the third path 45 of the path tube 46, not by moving the end of the third path 45 of the path tube 46 but by moving the ultrasonic horn 11 through the use of a movement mechanism.

The ejection tube 46a is constituted so that gas is blown thereinto by a method similar to that in the first embodiment.

In removing a used capillary from the ultrasonic horn, as illustrated in FIG. 11A, a capillary (also referred to as a first capillary) is removed from the capillary mounting hole of the ultrasonic horn 11 by loosening the capillary fastening screw, and is ejected through the third path 45 of the path tube 46 and the ejection tube 46a. At this time, the ejection tube 46a may be arranged so that the capillary drops straight downward by the force of gravity as indicated by an arrow 43.

In mounting a capillary for replacement onto the ultrasonic horn 11, as illustrated in FIG. 11B, once gas (air) is injected from the gas injection/suction tube, the air is blown into the end of the injection tube 46b of the path tube 46, and the capillary is transported to the capillary mounting hole of the ultrasonic horn 11 through the injection tube 46b of the path tube 46 and the third path 45, as indicated by an arrow 44. Since the inlet and outlet are different from each other, the operation of a mechanism section for replacement of an old capillary with a new capillary is not required.

Also in this embodiment, the similar effect to that of the first embodiment can be obtained.

Seventh Embodiment

FIGS. 12A to 12D illustrate a path tube and screw fastening unit of a capillary replacement device according to one aspect of the present invention. Here, the same reference sign is attached to the same part as each of those of FIG. 3 to FIG. 5 and only a different part will be explained.

The path tube includes an ejection tube 47 (also referred to as a fourth tube) for transporting the used capillary 13 and an injection tube 48 (also referred to as a first tube) for transporting a capillary for replacement.

A horn pressing pipe 49 (also referred to as a block) is arranged at a first end of the ejection tube 47. A horn pressing pipe 50 (also referred to as a block) is arranged at a first end of the injection tube 48. Moreover, the capillary replacement device includes a non-illustrated movement mechanism (also referred to as a first movement mechanism) for moving the first end of the ejection tube 47 and the first end of the injection tube 48. The used capillary 13 can be inserted into the horn pressing pipe 49 or the first end of the ejection tube 47, by moving the first end of the ejection tube 47 and the first end of the injection tube 48 through the use of this movement mechanism. By the use of the horn pressing pipes 49 and 50 made of a material harder than the ejection tube 47 and injection tube 48, deformation of the horn pressing pipes 49 and 50 can be suppressed in pressing the horn pressing pipes 49 and 50 against the ultrasonic horn 11, as compared with a case where the first end of each of the ejection tube 47 and injection tube 48 is pressed against the ultrasonic horn 11.

Moreover, the used capillary 13 may be inserted into the horn pressing pipe 49 or the first end of the ejection tube 47, not by moving the first end of each of the ejection tube 47 and injection tube 48 but by moving the ultrasonic horn 11 through the use of the movement mechanism.

The ejection tube 47 is constituted so as to suck gas from a second end by a method similar to that in the first embodiment, whereas the injection tube 48 is constituted so that gas is blown into a second end thereof by a method similar to that in the first embodiment.

In removing the used capillary 13 from the ultrasonic horn 11, as illustrated in FIG. 12A, the capillary 13 is removed from the capillary mounting hole of the ultrasonic horn 11 by aligning the horn pressing pipe 49 to the capillary 13 and loosening the capillary fastening screw, while the capillary is ejected through the ejection tube 47 as indicated by an arrow, as illustrated in FIG. 12B, by sucking gas (air) from the second end of the ejection tube 47 by the use of a gas injection/suction tube.

Note that, in this embodiment, the capillary 13 is ejected by sucking gas from the second end of the ejection tube 47, but the capillary 13 may be allowed to fall freely by the force of gravity without being sucked.

In mounting a capillary for replacement onto the ultrasonic horn 11, as illustrated in FIG. 12C, once the ultrasonic horn 11 is moved, as indicated by an arrow, onto the first end of the injection tube 48 or onto the horn pressing pipe 50 by the use of the movement mechanism and gas (air) is injected from the gas injection/suction tube, the air is blown into the second end of the injection tube 48, and as illustrated in FIG. 12D, the capillary 13 is transported to the capillary mounting hole of the ultrasonic horn 11 through the injection tube 48 as indicated by an arrow.

Also in this embodiment, the similar effect to that of the first embodiment can be obtained.

Eighth Embodiment

Figure 13:
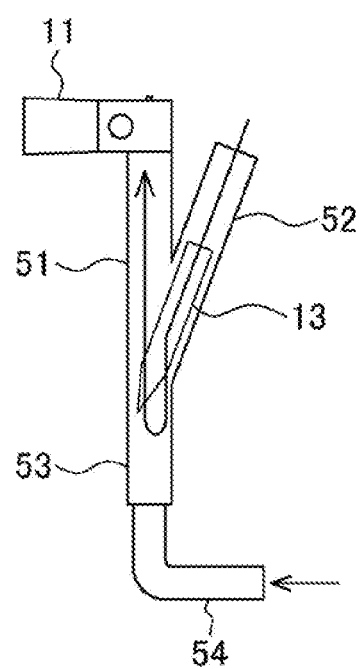
FIG. 13 is a cross-sectional view illustrating the path tube of a capillary replacement device according to one aspect of the present invention.

FIG. 13 is a cross-sectional view illustrating a path tube of a capillary replacement device according to one aspect of the present invention. Here, the same reference sign is attached to the same part as each of those of FIG. 3 to FIG. 5 and only a different part will be explained.

A path tube 53 includes a first tube 51 provided with a first path for transporting a capillary for replacement and a second tube 52 provided with a second path connected to the first path. A first end of an L-shaped third tube 54 is connected to a first end of the first tube 51. Note that, in this embodiment, the third tube 54 has an L-shape, but the third tube 54 may not have an L-shape if the third tube 54 is capable of being connected to the path tube 53. Furthermore, the first tube 51 and second tube 52 may be connected so that a capillary can pass therethrough.

A non-illustrated horn pressing pipe is arranged at a second end of the first tube 51 of the path tube 53. Furthermore, the capillary replacement device includes a non-illustrated movement mechanism for moving the first end of the first tube 51 of the path tube 53. The first end of the first tube 51 can be aligned relative to the capillary mounting hole of the ultrasonic horn 11, by moving the first end of the first tube 51 through the use of this movement mechanism.

Moreover, the horn pressing pipe or the first end of the first tube 51 may be aligned relative to the capillary mounting hole of the ultrasonic horn 11, not by moving the first end of the first tube 51 of the path tube 53 but by moving the ultrasonic horn 11 through the use of a movement mechanism.

The second tube 52 is constituted so that gas (air) is blown thereinto by a method similar to that in the first embodiment.

In mounting a capillary for replacement onto the ultrasonic horn 11, as illustrated in FIG. 13, once a capillary for replacement is inserted into the second tube 52 and gas (air) is injected from the gas injection/suction tube, the air is blown into the end of the second tube 52 and the capillary 13 is transported to the capillary mounting hole of the ultrasonic horn 11 through the second tube 52 and first tube 51 as indicated by an arrow.

Also in this embodiment, the similar effect to that of the first embodiment can be obtained.

Note that the above-described first to eighth embodiments may be implemented in combination with each other.

EXPLANATION OF SYMBOLS

11: ultrasonic horn
12: capillary mounting hole (also referred to as a mounting section)
13: capillary
14: capillary fastening screw
15: carrier
16: carrier cover
17: path tube
17*a*: first end
17*b*: second end
18: capillary interchange unit
19: stopper
20: stand
21: capillary cartridge
22: capillary extrusion pipe
22*a*: first end
22*b*: second end
23: air cylinder
24: gas injection/suction tube
25: horn pressing pipe (also referred to as a block)
26: bit
27: screw fastening unit
37: impact sensing sensor
38, 39, 42: slide plate
40: holding member
41: holding stand
43, 44: arrow
45: third path
46: path tube
46*a*, 47: ejection tube
46*b*, 48: injection tube
49, 50: horn pressing pipe (also referred to as a block)
51: first tube
52: second tube
53: path tube
54: third tube
121, 122, 123: capillary cartridge

The invention claimed is:

1. A capillary replacement device comprising:
a first tube for transporting a capillary;
an ultrasonic horn with a mounting section for mounting the capillary;
a first movement mechanism for relatively moving the ultrasonic horn and a first end of the first tube;
a mechanism for blowing gas into a second end of the first tube;
a mechanism for fixing the capillary to the mounting section;
a mechanism for removing the capillary fixed to the mounting section; and
a mechanism for sucking gas from the second end of the first tube.

2. The capillary replacement device according to claim 1, wherein the mechanism for blowing gas includes a second tube for pushing the capillary into the second end of the first tube and a second movement mechanism for moving the second tube.

3. The capillary replacement device according to claim 2, further comprising a block arranged at the first end of the first tube and made of a material harder than the first tube.

4. A capillary replacement device comprising:
a first tube for transporting a first capillary;
a second tube for transporting a second capillary;
an ultrasonic horn with a mounting section for mounting the first capillary;
a first movement mechanism for relatively moving the ultrasonic horn and a first end of the first tube as well as a first end of the second tube;
a mechanism for blowing gas into a second end of the second tube;
a mechanism for sucking gas from a second end of the first tube;
a mechanism for removing the first capillary fixed to the mounting section; and
a mechanism for fixing the second capillary to the mounting section.

5. A capillary replacement device comprising:
a first tube including a first path for transporting a first capillary, a second path for transporting a second capillary, and a third path where the first path and the second path are merged;
an ultrasonic horn with a mounting section for mounting the first capillary;
a first movement mechanism for relatively moving the ultrasonic horn and an end of the third path of the first tube;
a mechanism for blowing gas into an end of the second path of the first tube;
a mechanism for removing the first capillary fixed to the mounting section; and
a mechanism for fixing the second capillary to the mounting section.

* * * * *